US006962849B1

(12) United States Patent
Kamal et al.

(10) Patent No.: US 6,962,849 B1
(45) Date of Patent: Nov. 8, 2005

(54) HARD MASK SPACER FOR SUBLITHOGRAPHIC BITLINE

(75) Inventors: Tazrien Kamal, San Jose, CA (US); Weidong Qian, Sunnyvale, CA (US); Kouros Ghandehari, Santa Clara, CA (US); Taraneh Jamali-Beh, Santa Cruz, CA (US); Mark T. Ramsbey, Sunnyvale, CA (US); Ashok M. Khathuria, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 96 days.

(21) Appl. No.: 10/729,732

(22) Filed: Dec. 5, 2003

(51) Int. Cl.[7] .......................................... H01L 21/336
(52) U.S. Cl. .................................................. 438/257
(58) Field of Search ............................... 438/257, 263, 438/264, 265

(56) References Cited

U.S. PATENT DOCUMENTS

| | | | |
|---|---|---|---|
| 5,418,176 A * | 5/1995 | Yang et al. ................. | 438/262 |
| 6,215,148 B1 | 4/2001 | Eitan | |
| 6,383,952 B1 | 5/2002 | Subramanian et al. | |
| 6,410,388 B1 | 6/2002 | Kluth et al. | |
| 6,436,768 B1 | 8/2002 | Yang et al. | |
| 6,440,797 B1 | 8/2002 | Wu et al. | |
| 6,465,303 B1 | 10/2002 | Ramsbey et al. | |
| 6,477,084 B1 | 11/2002 | Eitan | |
| 6,479,348 B1 | 11/2002 | Kamal et al. | |
| 6,492,670 B1 | 12/2002 | Yu | |
| 6,524,913 B1 | 2/2003 | Lin et al. | |
| 6,566,194 B1 | 5/2003 | Ramsbey et al. | |
| 6,573,140 B1 | 6/2003 | Ogura et al. | |
| 6,590,811 B1 | 7/2003 | Hamilton et al. | |
| 6,617,215 B1 | 9/2003 | Halliyal et al. | |
| 6,620,717 B1 | 9/2003 | Kamal et al. | |
| 6,630,384 B1 | 10/2003 | Sun et al. | |
| 6,653,190 B1 | 11/2003 | Yang et al. | |
| 6,872,609 B1 * | 3/2005 | Kamal et al. ............... | 438/194 |
| 6,884,681 B1 * | 4/2005 | Kamal et al. ............... | 438/258 |
| 2003/0232507 A1 * | 12/2003 | Chen ........................... | 438/763 |

OTHER PUBLICATIONS

Mori et al., "ONO inter-poly dielectric scaling for nonvolatile memory applications", Feb. 1991, IEEE Transactions on Electron Devices, vol. 38, Issue 2, pp. 386-391.*
Cheng-Sheng et al., "A scaling methodology for oxide-nitride-oxide interpoly dielectric for EPROM applications", Jun. 1990, IEEE Transactions on Electron Devices, pp. 1439-1443.*
Solid State Technology's WaferNEWS, The Semiconductor Equipment and Materials Weekly Briefing, Mar. 17, 2003, V10n22, 11 pgs.

* cited by examiner

*Primary Examiner*—Evan Pert
(74) *Attorney, Agent, or Firm*—Eschweiler & Associates, LLC

(57) ABSTRACT

A technique for forming at least part of an array of a dual bit memory core is disclosed. Spacers are utilized in the formation process to reduce the size of buried bitlines in the memory, which is suitable for use in storing data for computers and the like. The smaller (e.g., narrower) bitlines facilitate increased packing densities while maintaining an effective channel length between the bitlines. The separation between the bitlines allows dual bits that are stored above the channel within a charge trapping layer to remain sufficiently separated so as to not interfere with one another. In this manner, one bit can be operated on (e.g., for read, write or erase operations) without substantially or adversely affecting the other bit. Additionally, bit separation is preserved and leakage currents, cross talk, as well as other adverse effects that can result from narrow channels are mitigated, and the memory device is allowed to operate as desired.

31 Claims, 9 Drawing Sheets

HARD MASK SPACER FOR SUBLITHOGRAPHIC BITLINE

RELATED APPLICATIONS

This application is related to U.S. patent application Ser. No. 10/755,430, filed on Jan. 12, 2004, entitled "NARROW BITLINE USING SAFIER FOR MIRROR BIT".

FIELD OF INVENTION

The present invention relates generally to memory for computer systems and the like, and in particular to utilizing a spacer when fabricating a memory device so as to reduce bitline width thereby facilitating scaling and increased packing density.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where single bits of data are stored in and read from respective memory cells. The cells are generally programmed by hot electron injection and erased by Fowler-Nordheim tunneling. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by applying a relatively high voltage to the control gate and connecting the source to ground and the drain to a predetermined potential above the source. A resulting high electric field across the tunnel oxide leads to the Fowler-Nordheim tunneling phenomena. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

A very modern memory technology is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

As device sizes and features are continually scaled down, however, leakage currents, cross talk and other issues can arise. Limitations in photoresists and other materials and/or techniques utilized in patterning the semiconductor substrate as well as other materials out of which the memory cells are fashioned can, for example, limit the size to which some features, such as wordlines and/or bitlines, can be reduced. One technique to pack more cells into a smaller area is to form the structures closer together. Forming bitlines, for example, closer together shortens the length of the channel defined therebetween. Shortening the channel in such a manner can, however, lead to leakage currents as well as other undesirable performance issues. For example, charge or bit isolation between the two bits stored in the charge trapping layer becomes increasingly difficult as the channel length is decreased and the bits are brought closer together. In this manner, cross-talk can occur, the bits can contaminate one another and operations performed on one bit can affect the other bit (sometimes referred to complimentary bit disturb or CBD). Accordingly, it would be desirable to reduce feature sizes so as to increase packing density while mitigating the adverse affects that may result therefrom.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to utilizing spacers to reduce the size of bitlines in fashioning a dual bit memory device thereby allowing for increased packing density while maintaining an effective length of a channel defined between the bitlines. In this manner, bit separation is preserved and leakage currents, cross talk, as well as other adverse effects that can result from narrow channels are mitigated allowing the memory device to operate as desired.

According to one or more aspects of the present invention, a method of forming at least a portion of a memory core array upon a semiconductor substrate is disclosed. The method includes forming a charge trapping dielectric layer over the substrate and then forming a hardmask over the charge trapping dielectric layer. The hardmask is then patterned to form a plurality of hardmask features having a first spacing there-between. A spacer material is then formed over the patterned hardmask and is patterned to form spacers adjacent to the hardmask features and defining a second spacing between the hardmask features that is less than the first spacing. A bitline implant is then performed through the charge trapping dielectric layer, using the patterned hardmask and spacers as an implantation mask to establish buried bitlines within the substrate having a width corresponding to the second spacing. The patterned hardmask and spacers are then removed and a wordline material is formed over the charge trapping dielectric layer. Finally, the wordline material is patterned to form wordlines that overlie the bitlines. The spacers residing adjacent to the patterned hardmask reduce the implantation mask opening to a size less than otherwise obtainable via the lithography tools, thereby facilitating narrowing of the resultant buried bitlines. The narrowing of the bitlines facilitates an improved dual bit memory cell density in the core region without requiring a reduction in a channel length of the memory cells.

In accordance with one or more other aspects of the present invention a method of forming at least a portion of a dual bit memory core array upon a semiconductor substrate is disclosed. The method includes forming at least a portion of a charge trapping dielectric layer over the substrate and forming a layer of sacrificial material over the portion of the charge trapping dielectric layer. A hardmask is then formed over the sacrificial layer and is patterned to form a plurality of hardmask features having a first spacing there-between. A spacer material is then formed over the patterned hardmask and is patterned to form spacers adjacent the hardmask features and defining a second spacing between the hardmask features that is less than the first spacing. A bitline implant is then performed through the portion of the charge trapping dielectric layer to establish buried bitlines within the substrate having a width corresponding to the second spacing. The patterned hardmask and spacers are then removed and a remaining portion of the charge trapping layer is then formed over the portion of the charge trapping dielectric layer.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
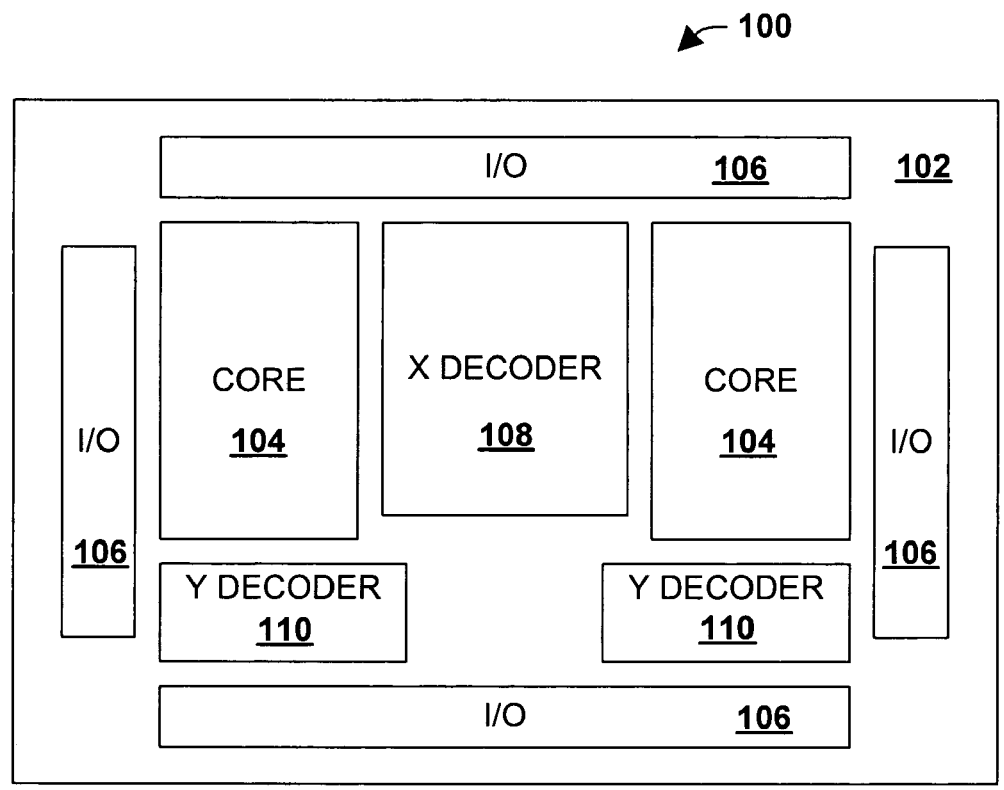
FIG. 1 is a top view of a dual bit flash memory device.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to utilizing spacers to reduce the size of buried bitlines in dual bit flash memory suitable for use in storing data for computers and like devices. The smaller (e.g., more narrow) bitlines facilitate increased packing densities while maintaining an effective channel length between the bitlines. The separation between the bitlines allows for two bits that are stored above the channel within a charge trapping layer to remain separate and apart so as to not interfere with one another. In this manner, one bit can be operated upon (e.g., programmed, erased or read) without affecting the other bit. Additionally, bit separation is preserved and leakage currents, cross talk, as well as other adverse effects that can result from narrow channels are mitigated, and the memory device is allowed to operate as desired.

Referring initially to FIG. 1, a top view of an exemplary dual bit flash EEPROM 100 is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
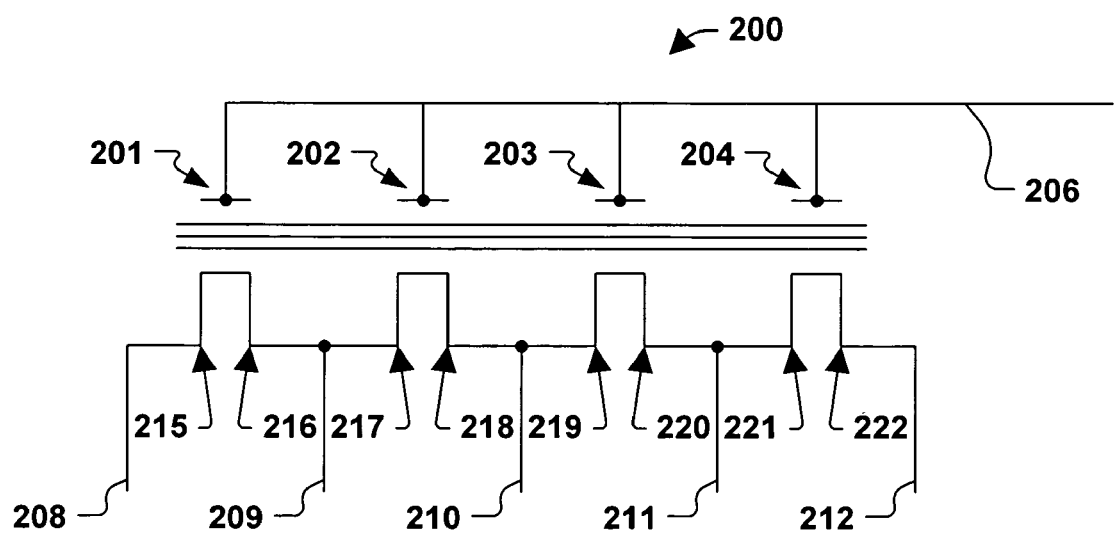
FIG. 2 is a schematic illustration of a portion of a memory core such as may include at least part of one of the cores depicted in FIG. 1 in a virtual ground type configuration.

Turning to FIG. 2, a schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
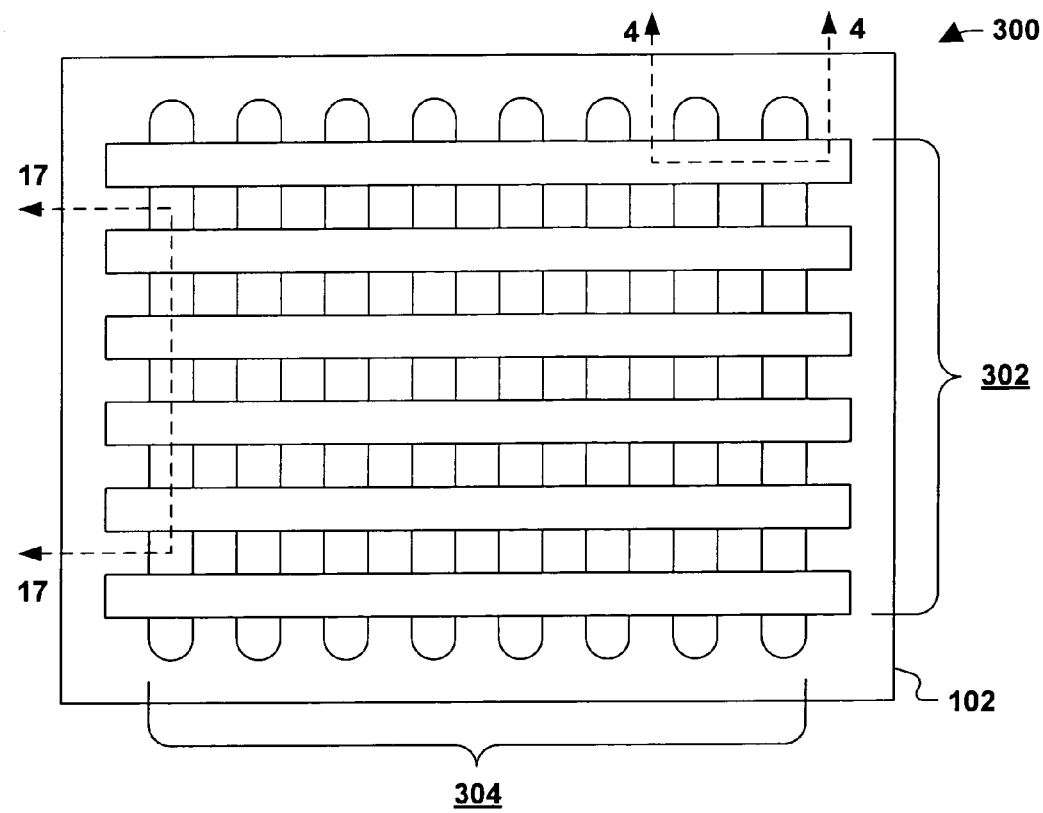
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
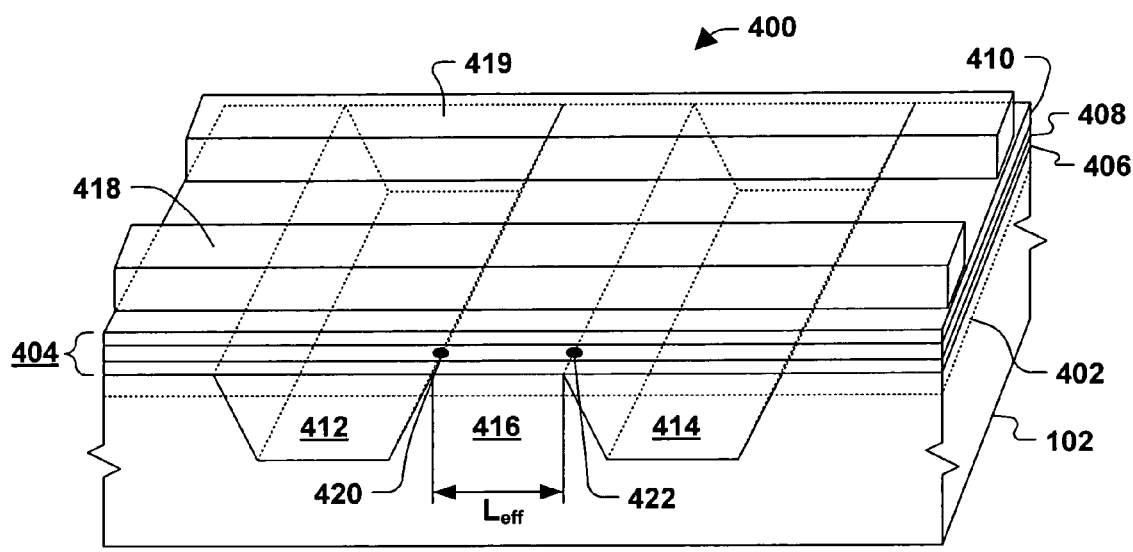
FIG. 4 is a cross-sectional isometric illustration of a portion of a dual bit flash memory, such as that taken along line 4—4 of FIG. 3.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 419 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another. Accordingly, the degree to which the memory can be scaled via channel length reduction in some cases is limited and a technique for reducing the size of the device without reducing the channel length (e.g., below some effective length $L_{eff}$) would be desirable.

Figure 5:
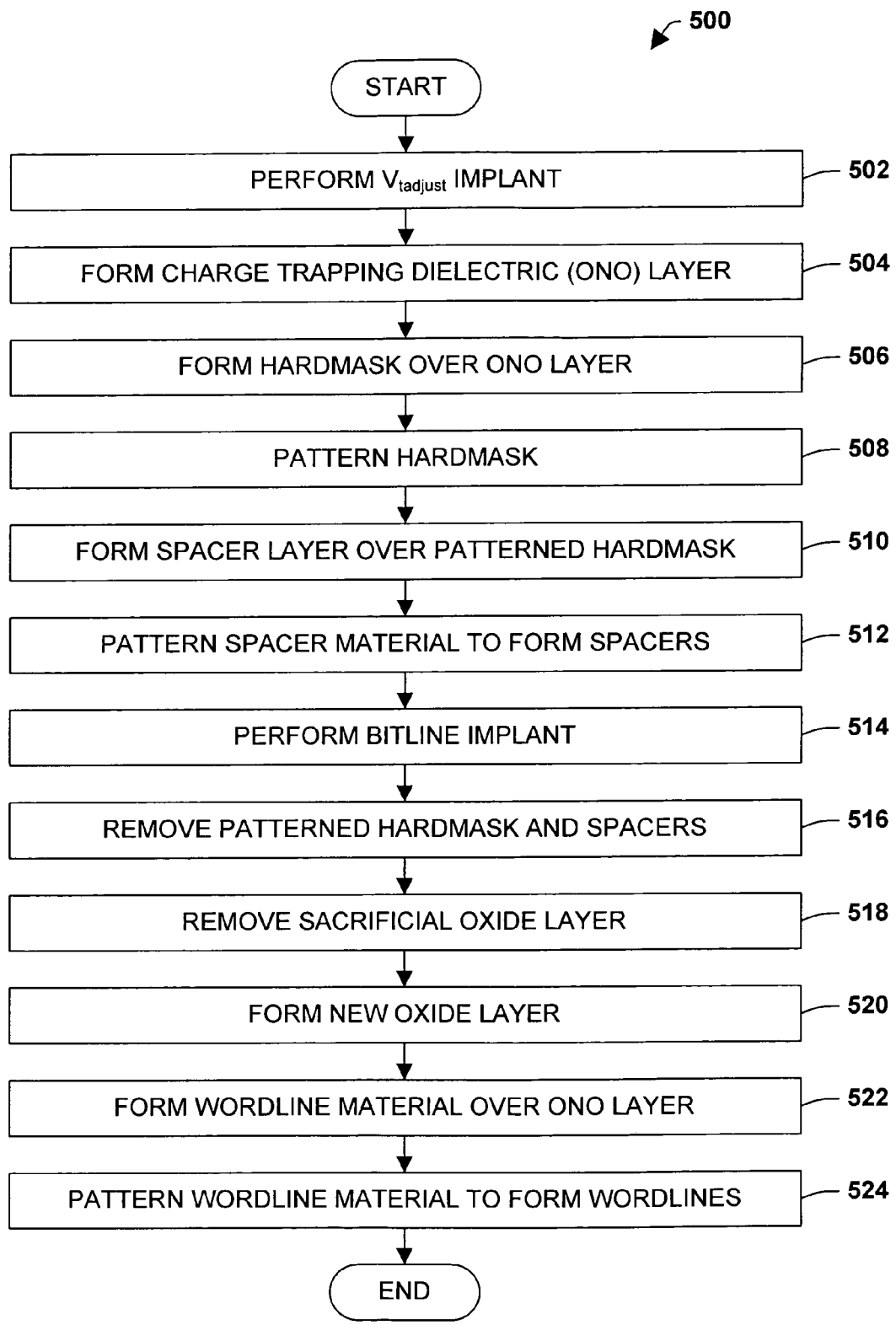
FIG. 5 is a flow diagram illustrating an example of a methodology for forming a memory device in accordance with one or more aspects of the present invention wherein bitline sizes are reduced via the use of spacers, thereby providing for increased packing density.

Turning to FIG. 5, a methodology 500 is illustrated for forming a memory device according to one or more aspects of the present invention. In particular, the memory is formed so as to facilitate scaling via bitline width reduction which was heretofore not capable due to limitations associated with resists and/or other patterning materials, techniques or lithography tools. The memory device so formed may, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 6–17, as well as to devices not shown or described herein.

The memory is formed upon a semiconductor substrate and at 502 a threshold adjustment implant $V_{tadjust}$ is performed to establish a region of the substrate that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory.

At 504 a charge trapping dielectric layer is formed over the semiconductor substrate. The charge trapping dielectric layer may be a multilayer material that includes a first insulating layer, a charge-trapping layer, and a second insulating layer. The first and second insulating layers may be formed of an oxide dielectric such as silicon dioxide ($SiO_2$), for example, and the charge-trapping layer may be formed of a nitride dielectric such as silicon nitride ($Si_xN_y$), for example. The oxide-nitride-oxide configuration is commonly referred to as an ONO layer for convenience. Alternatively, poly-islands or other types of charge trapping dielectrics may be formed in accordance with the present invention.

The first insulating layer can be formed to a thickness of about 70 Angstroms or less, for example, while the charge trapping layer can be formed to a thickness between about 60 to 80 Angstroms, for example. The second insulating layer can be formed to a thickness between about 100 to 200 Angstroms, for example. The second insulating layer is formed to a greater thickness relative to the other layers since it may be exposed to and altered by subsequent processing conditions. As set forth below, this layer may ultimately be stripped and re-applied at a desired (e.g., lesser) thickness to re-establish uniformity and to facilitate desired device operation once particular processing has been completed. The second insulating layer may, accordingly, be referred to as a sacrificial oxide. In the above regard, since the top layer may act as a sacrificial layer, the layer need only be generally selective with respect to the spacer layer material to be described infra and then selective with respect to the underlying charge trapping layer so that during its subsequent removal, the charge trapping layer will not be adversely damaged.

A layer of hardmask material is then formed over the ONO layer at 506. An optional antireflective coating (ARC) layer (e.g., of an organic material, such as silicon nitride or silicon oxynitride) can be formed over the hardmask, and a resist can be formed over the ARC layer to facilitate patterning the hardmask. The ARC layer in particular assists with mitigating reflection during exposure and thereby improves the fidelity of pattern transfer.

The hardmask is then patterned at 508 (e.g., after both the resist and optional ARC layers have been patterned, exposed, etched and/or selectively stripped to form a combined photomask for transferring the pattern onto the hardmask). The patterned features formed (e.g., etched) within the hardmask correspond, at least partially, to buried bitlines which will be formed within the substrate. The hardmask can, for example, be formed from nitride and/or poly-based material(s) that are applied to a thickness of between about 300 to 700 Angstroms, for example.

At 510 a layer of spacer material (e.g., of nitride and/or poly-based material(s)) is formed over the patterned hardmask. The spacer material is utilized to form spacers that assist with establishing narrower buried bitlines. As such, the spacer material is then patterned (e.g., etched) at 512 to form spacers adjacent the patterned features of the hardmask, thereby reducing a spacing between the hardmask features. A bitline implant is then performed at 514 to establish the buried bitlines within the semiconductor substrate. The bitline implant can include an n-type dopant, such as Arsenic, for example, and can be performed at a concentration of between about 5E14 and 2E15 atoms/cm$^3$ at an energy level of between about 40 to 70 KeV, for example. The distance between spacers defining a bitline opening and thus the width of implanted bitlines can be between about 40 to 100 nano-meters, for example.

The patterned hardmask and spacers are then removed (e.g., stripped away) at 516. Similarly, the second oxide layer or other type sacrificial material is removed at 518. This sacrificial oxide layer may be removed since it may have become damaged and/or made somewhat non-uniform as a result of other processing activities, such as via exposure to etchants and/or plasma during patterning of the hardmask and/or spacer material(s), for example.

A new second insulating layer, for example, an oxide, is thus formed over the charge trapping layer at 520. This layer can be formed to a thickness of about 100 Angstroms or less, for example. A layer of wordline material is then formed over the ONO layer at 522. The wordline material can, for example, include polysilicon. Finally, the wordline material is patterned at 524 to establish wordlines over the buried bitlines (e.g., as depicted in FIGS. 3 and 4). The methodology may then continue on for further processing.

Figure 6:
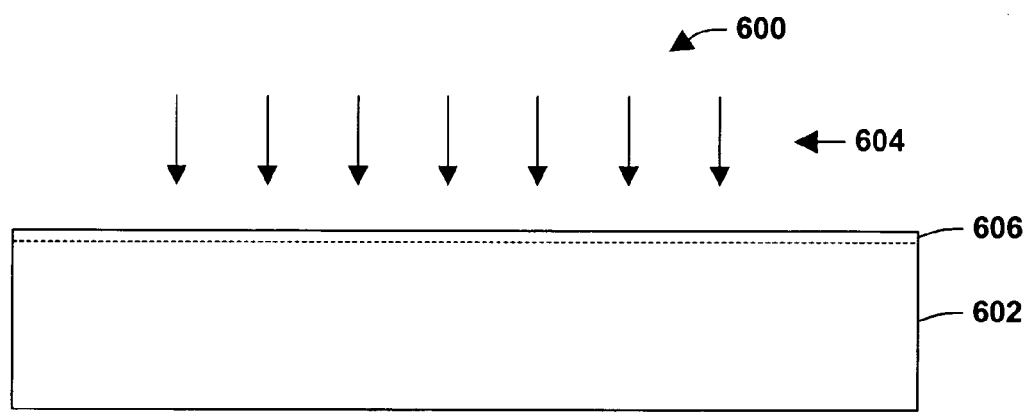
FIGS. 6–17 are cross-sectional illustrations of memory formed according to one or more aspects of the present invention.

Turning now to FIGS. 6–17, an exemplary technique for forming a memory device 600 according to one or more aspects of the present invention is disclosed (FIG. 6). In particular, the memory 600 is formed in a manner that facilitates scaling and resultant enhanced packing density via reducing the size of buried bitlines which was heretofore not feasible due to limitations associated with resists, patterning materials or lithography tools. The memory device 600 so formed may, for example, correspond to a portion of a memory core such as may include at least part of one of the M by N array cores depicted in FIG. 1.

Initially, a semiconductor substrate 602 upon which the memory is formed is subjected to a threshold adjustment implant 604 to establish a region 606 of the substrate 602 that is more heavily doped than the remainder of the semiconductor substrate (FIG. 6). The substrate may itself be doped with a p-type dopant such as Boron, for example, and the threshold adjustment implant ($V_{tadjust}$) may include a greater concentration of and/or a higher energy implant of the same or different p-type dopant, for example. The threshold adjustment implant 606 assists in controlling a threshold voltage of the memory device 600. The threshold adjustment implant, however, is optional and may be skipped in accordance with the present invention.

It is to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Figure 7:
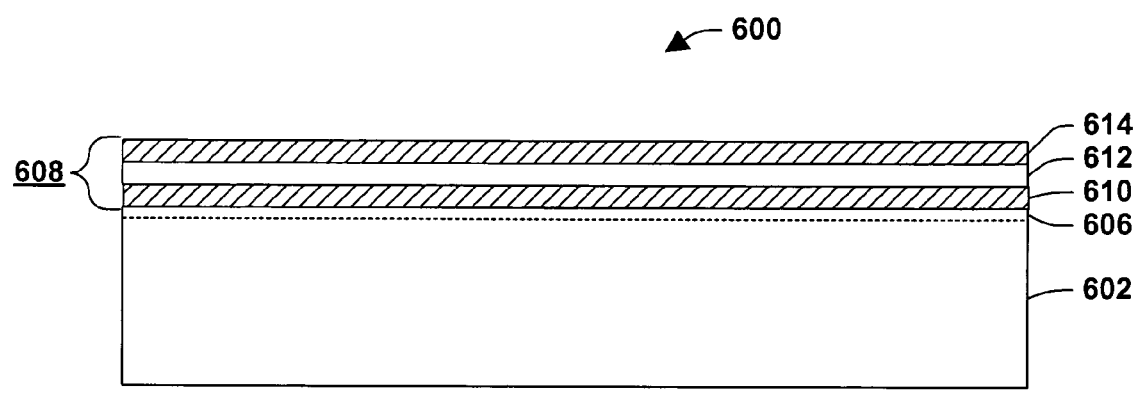

A charge trapping dielectric layer 608 is formed over the semiconductor substrate 602 (FIG. 7). The charge trapping dielectric layer 608 may be a multilayer material that includes a first insulating layer 610, a charge-trapping layer 612, and a second insulating layer 614, for example. The first 610 and second 614 insulating layers may be formed of an oxide dielectric such as silicon dioxide ($SiO_2$), for example, and the charge-trapping layer 612 may be formed of a nitride dielectric such as silicon nitride ($Si_xN_y$), for example. The oxide-nitride-oxide configuration is commonly referred to as an ONO layer for convenience.

The first insulating layer 610 can be formed to a thickness of about 70 Angstroms or less, for example, while the charge trapping layer 612 can be formed to between about 60 to 80 Angstroms, for example. The second insulating layer 614 can be formed to between about 100 to 200 Angstroms, for example. The second insulating layer 614 is formed to a greater thickness relative to the other layers since it may be exposed to and altered by subsequent processing conditions. As discussed below, this layer 614 may ultimately be stripped and re-applied at a desired (e.g., lesser) thickness to re-establish uniformity and to facilitate desired device operation once particular processing activities have been completed. The second insulating layer 614 may, accordingly, be referred to as a sacrificial oxide.

Figure 8:
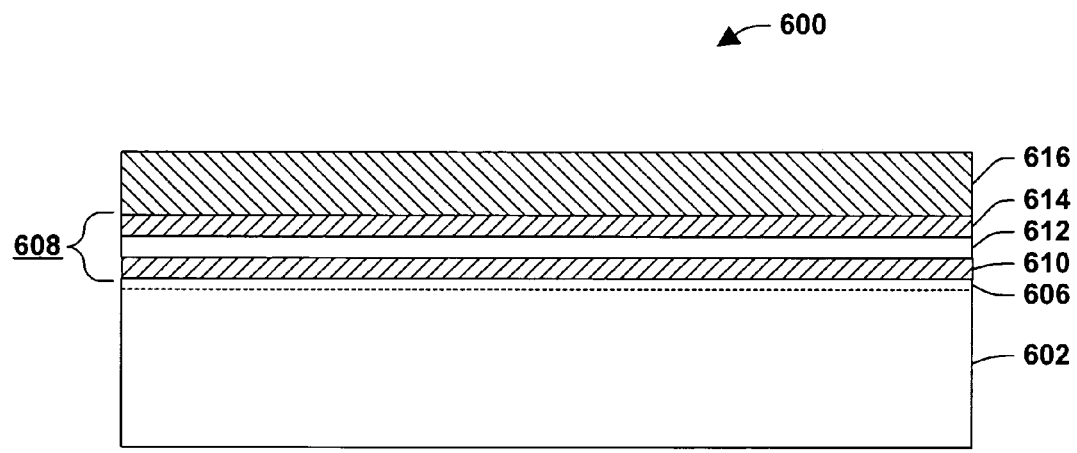

A layer of hardmask material 616 is then formed over the ONO layer 608 (FIG. 8). Although not shown, an optional antireflective coating (ARC) layer (e.g., of an organic material, such as silicon nitride or silicon oxynitride) can be formed over the hardmask, and a resist (also not shown) can be formed over the ARC layer to facilitate patterning the hardmask 616. The ARC layer in particular assists with mitigating reflection during resist exposure and thereby improves the fidelity of pattern transfer.

Figure 9:
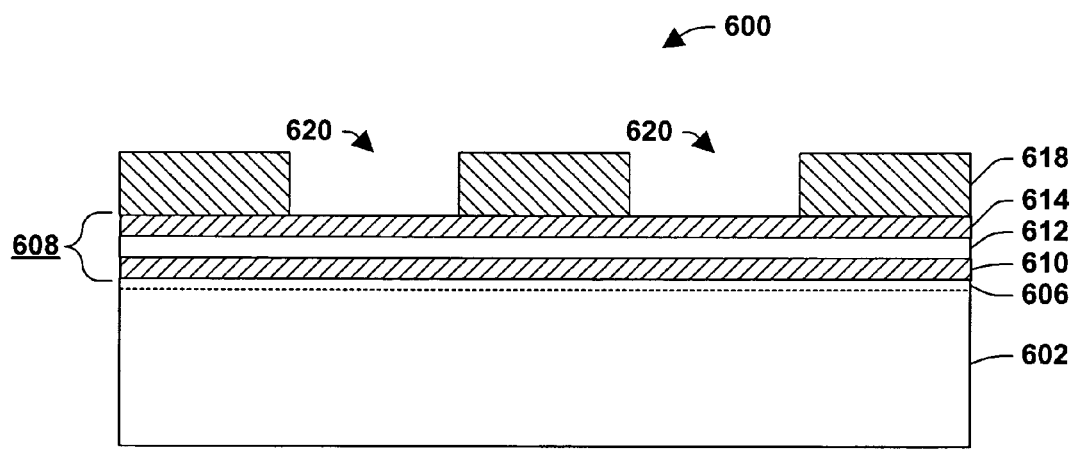

The hardmask 616 is then patterned (FIG. 9). For example, after both the resist and optional ARC layers have been exposed and patterned to form a combined photomask, that pattern is transferred onto the hardmask 616. The patterned features 618 formed (e.g., etched) within the hardmask 616, and more particularly apertures 620 defined between the features 618 correspond, at least partially, to buried bitlines which will be formed within the substrate. By way of example, the hardmask 616 may be formed from nitride and/or poly-based material(s) that are applied to a thickness of between about 300 to 700 Angstroms, although other materials may also be utilized in accordance with the present invention.

Figure 10:
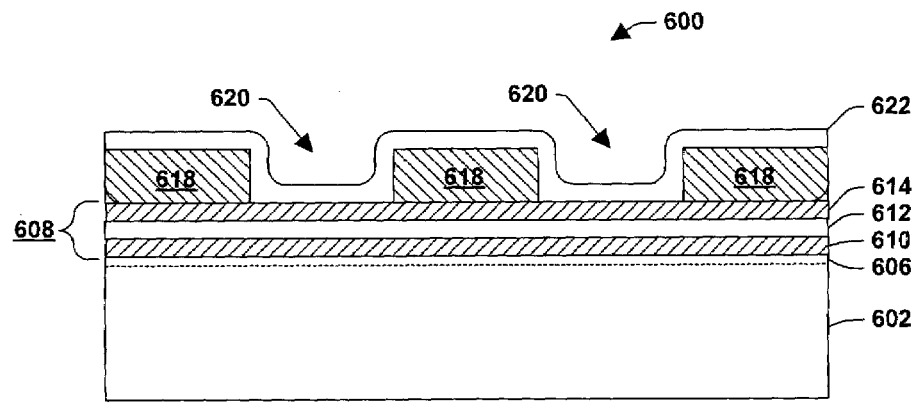
Figure 11:
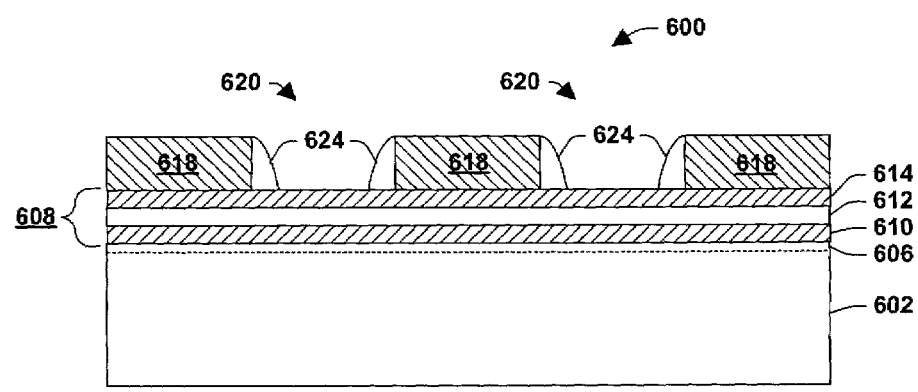

A layer of spacer material 622 (e.g., of nitride and/or poly-based material(s)) is subsequently formed over the features 618 and the apertures 620 defined there-between (FIG. 10). The spacer material 622 is utilized to form spacers that assist with establishing narrower buried bitlines. As such, the spacer material 622 is then patterned (e.g., etched) to form spacers 624 adjacent the patterned features 618 of the hardmask material (FIG. 11), wherein a thickness of the spacers 624 corresponds to a thickness of the deposited spacer layer.

Figure 12:
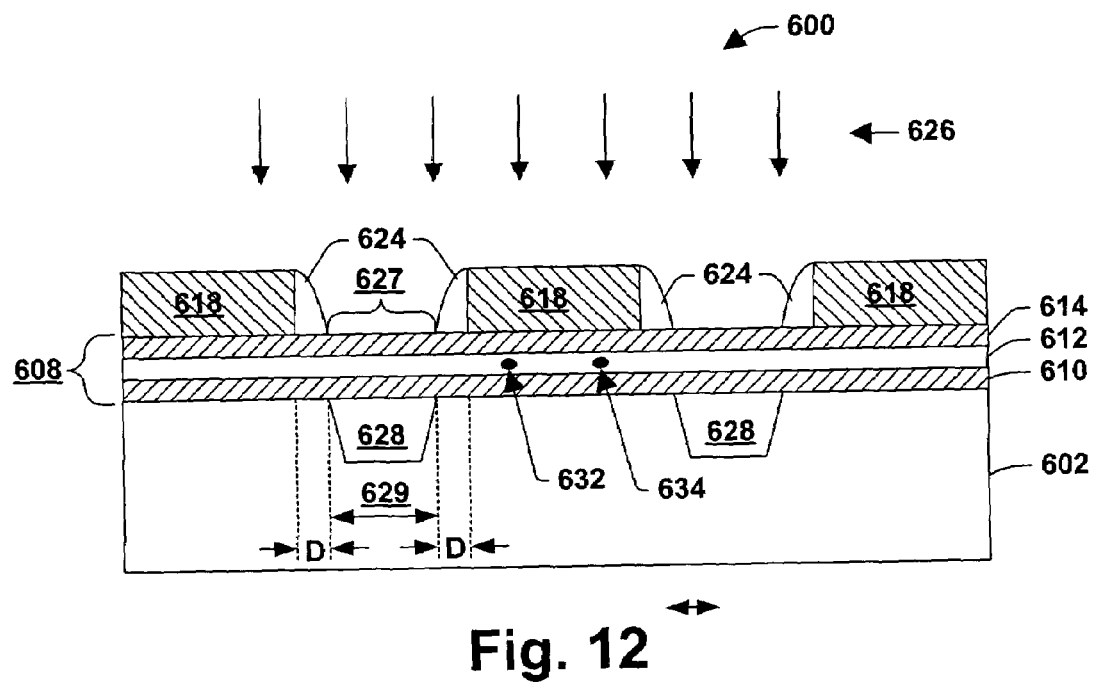

A bitline implant 626 is then performed to establish buried bitlines 628 within the semiconductor substrate 602 (FIG. 12). The bitline implant 626 can include Arsenic, for example, and can be performed at a concentration of between about 5E14 and 2E15 atoms/cm$^3$ at an energy level of between about 40 to 70 KeV. The distance between corresponding pairs of spacers define a bitline opening 627, and allow the implanted bitlines to be formed to a substantially corresponding width 629 and thus reduced to between about 40 to 100 nano-meters or smaller, for example.

It will be appreciated that the spacers 624 inhibit the dopant 626 from being implanted within the semiconductor substrate 602 at locations below the spacers 624. Accordingly, the buried bitlines 628 are narrower than conventional bitlines by an amount substantially equal to the width of corresponding pairs spacers 624 lining the opening 629. By way of example, bitlines 628 have a width of 629 in the illustrated example, whereas conventional bitlines, such as bitlines 412 illustrated in FIG. 4, for example, that are formed without utilizing such spacers have an additional width of 2D or an additional width corresponding to the width of a pair of lining spacers.

Figure 13:
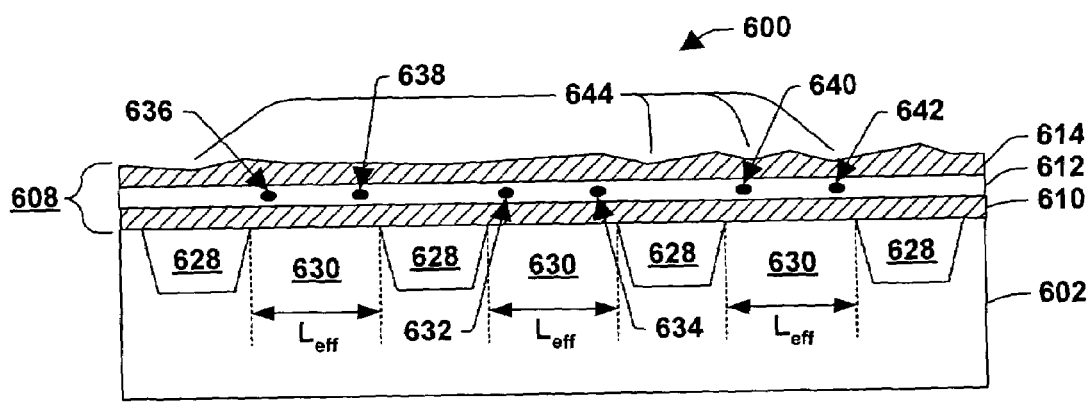
Figure 14:
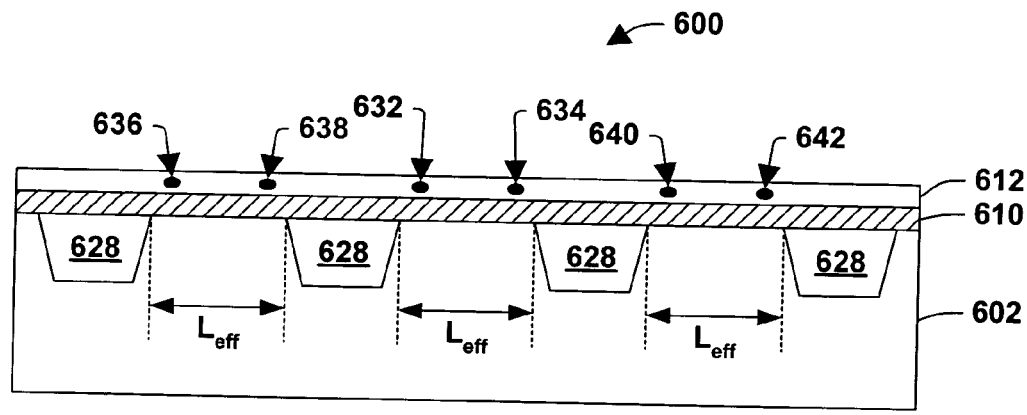

In this manner, the length of a channel 630 defined between respective sets of bitlines is maintained at an effective channel length ($L_{eff}$), where stored bits, such as bits 632 and 634, are sufficiently isolated from one another at a channel length of $L_{eff}$ such that the bits do not disturb one another and one bit remains substantially unaffected when the other bit is acted upon (e.g., a read, write or erase operation) (FIG. 13). This allows more bits of information to be stored within the same area of memory, such as bits 632, 634, 636, 638, 640 and 642, for example. As such, more bitlines can be formed within the semiconductor substrate 402 and packing density can thus be enhanced without compromising device performance.

Figure 15:
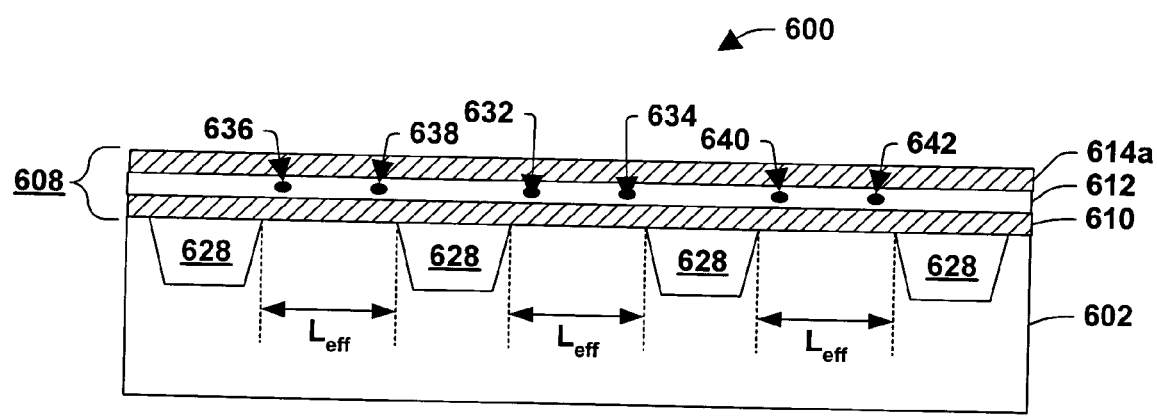

The patterned hardmask features 618 and spacers 624 are removed (e.g., stripped away) to reveal the second insulating layer 614 (FIG. 13). It will be appreciated that this sacrificial oxide layer 614 (or other sacrificial material) may have become damaged and/or made somewhat non-uniform as a result of one or more processing activities (e.g., etching) and may thus include pitting 644 as well as other irregularities. Accordingly, the sacrificial oxide layer 614 is removed (FIG. 14) and replaced with a new second insulating layer 614a (FIG. 15). This new second insulating layer 614a can be formed to a thickness of about 100 Angstroms or less, for example.

Figure 16:
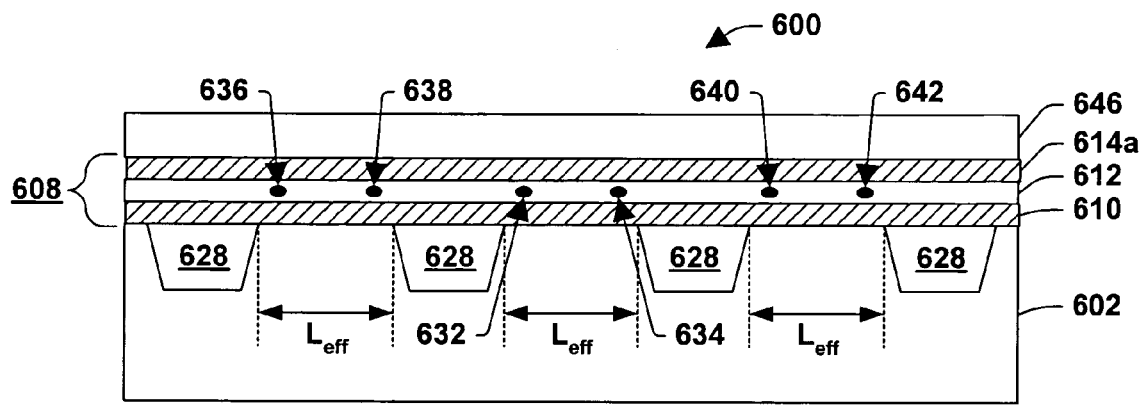
Figure 17:
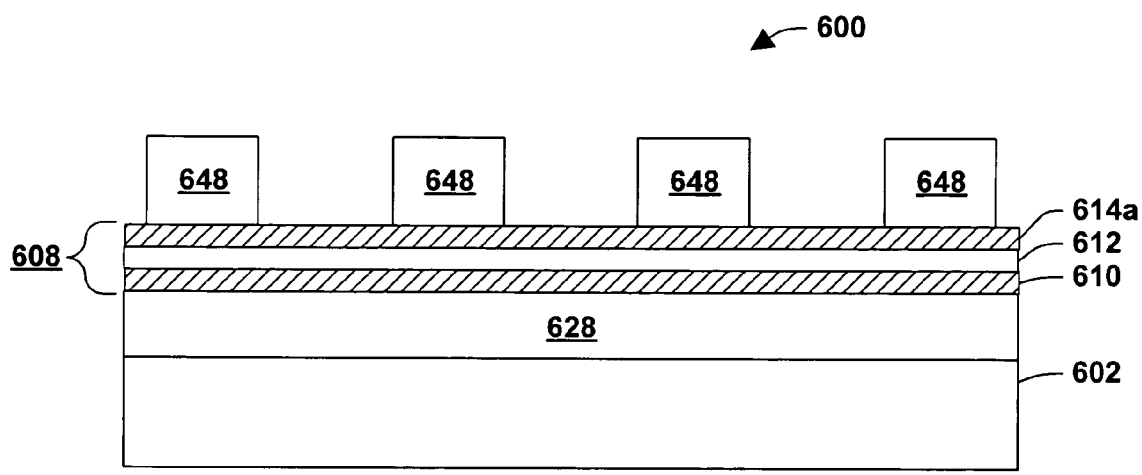

A layer of wordline material 646 is then formed over the ONO layer 608 (FIG. 16). The wordline material 646 can, for example, include polysilicon or other type of conductive material. Finally, the wordline material 646 is patterned to establish wordlines 648 over the buried bitlines (FIG. 17). It will be appreciated that FIG. 17 may correspond to the device depicted in FIG. 3 taken along lines 17—17. Accordingly, the illustration depicted in FIG. 17 is rotated 90 degrees relative to the images illustrated in FIGS. 6–16. As such, a side view or view along the length of a buried bitline 628 is illustrated in FIG. 17. Also, it will be appreciated that the buried bitlines 628 and the wordlines 648 are oriented at substantially right angles relative to one another.

It will be further appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a dual bit memory core array upon a semiconductor substrate, the method comprising:
   forming a charge trapping dielectric layer over the substrate;
   forming a hardmask over the charge trapping dielectric layer;
   patterning the hardmask to form a plurality of hardmask features having a first spacing therebetween;
   forming a spacer material over the patterned hardmask;
   patterning the spacer material to form spacers adjacent the hardmask features and defining a second spacing between the hardmask features that is less than the first spacing;
   performing a bitline implant through the charge trapping dielectric to establish buried bitlines within the substrate having a width corresponding to the second spacing;
   removing the entire patterned hardmask and all the spacers associated with the patterned hardmask;
   forming a wordline material over the charge trapping dielectric layer; and
   patterning the wordline material to form wordlines that overlie the bitlines.

2. The method of claim 1, wherein the substrate is p-type and the bitline implant is performed with an n-type dopant, and wherein the spacers inhibit the dopant from being implanted there-under, the spacers thus serving to establish bitlines that are narrower than the first spacing.

3. The method of claim 2, wherein the bitline implant dopant includes Arsenic.

4. The method of claim 3, wherein the bitline implant is performed at a concentration of between about 5E14 and 2E15 atoms/cm3.

5. The method of claim 3, wherein the bitline implant is performed at an energy level of between about 40 to 70 KeV.

6. The method of claim 1, wherein forming a charge trapping dielectric layer comprises:
   forming a first insulating layer over the semiconductor substrate;

forming a charge trapping layer over the first insulating layer; and forming a second insulating layer over the charge trapping layer.

7. The method of claim 6, wherein the first and second insulating layers comprise silicon dioxide.

8. The method of claim 6, wherein the charge-trapping layer comprises silicon nitride.

9. The method of claim 6, wherein the first insulating layer is formed to a thickness of about 70 Angstroms or less.

10. The method of claim 6, wherein the charge trapping layer is formed to a thickness of between about 60 to 80 Angstroms.

11. The method of claim 6, wherein the second insulating layer is formed to a thickness of about 100 Angstroms or less.

12. The method of claim 6, further comprising:
removing the second insulating layer; and
re-applying the second insulating layer to a thickness of about 100 Angstroms or less.

13. The method of claim 12, wherein the removed second insulating layer layer is initially formed to a thickness of between about 100 to 200 Angstroms.

14. The method of claim 1, wherein at least one of the hardmask and spacers are formed of nitride or poly-based material(s).

15. The method of claim 2, wherein the implanted bitlines have a width of between about 40 to 100 nano-meters or less.

16. The method of claim 1, wherein the wordlines are oriented at substantially right angles relative to the buried bitlines.

17. The method of claim 1, comprising:
performing a threshold adjustment implant into the semiconductor substrate prior to forming the charge trapping dielectric layer.

18. The method of claim 17, wherein the substrate is doped with a p-type dopant and the threshold adjustment implant includes at least one of a greater concentration of and a higher energy implant of the same or different p-type dopant.

19. The method of claim 18, wherein the threshold adjustment implant includes Boron.

20. The method of claim 1, wherein the substrate comprises silicon.

21. A method of forming at least a portion of a dual bit memory core array upon a semiconductor substrate, the method comprising:
forming at least a portion of a charge trapping dielectric layer over the substrate;
forming a layer of sacrificial material over the portion of the charge trapping dielectric layer;
forming a hardmask over the sacrificial layer;
patterning the hardmask to form a plurality of hardmask features having a first spacing therebetween;
forming a spacer material over the patterned hardmask;
patterning the spacer material to form spacers adjacent the hardmask features and defining a second spacing between the hardmask features that is less than the first spacing;
performing a bitline implant through the portion of the charge trapping dielectric layer to establish buried bitlines within the substrate having a width corresponding to the second spacing;
removing the patterned hardmask and spacers; and
forming a remaining portion of the charge trapping layer over the portion of the charge trapping dielectric layer.

22. The method of claim 21, wherein forming at least a portion of a charge trapping dielectric layer comprises:
forming a first insulating layer over the semiconductor substrate; and
forming a charge trapping layer over the first insulating layer.

23. The method of claim 22, wherein forming a layer of sacrificial material comprises:
forming a second insulating layer over the charge trapping layer.

24. The method of claim 23, wherein the first and second insulating layers comprise silicon dioxide.

25. The method of claim 22, wherein the charge-trapping layer comprises silicon nitride.

26. The method of claim 22, wherein the first insulating layer is formed to a thickness of about 70 Angstroms or less.

27. The method of claim 22, wherein the charge trapping layer is formed to a thickness of between about 60 to 80 Angstroms.

28. The method of claim 21, wherein the remaining portion of the charge trapping layer is formed to a thickness of about 100 Angstroms or less.

29. The method of claim 21, wherein the layer of sacrificial material is formed to a thickness of between about 100 to 200 Angstroms.

30. The method of claim 21, wherein the implanted bitlines have a width of between about 40 to 100 nano-meters or less.

31. The method of claim 21, further comprising:
forming a wordline material over the charge trapping dielectric layer; and
patterning the wordline material to form wordlines that overlie the bitlines.

* * * * *